(12) United States Patent
Kim et al.

(10) Patent No.: US 10,727,075 B2
(45) Date of Patent: Jul. 28, 2020

(54) UNIFORM EUV PHOTORESIST PATTERNING UTILIZING PULSED PLASMA PROCESS

(71) Applicant: Applied Materials, Inc., Santa Clara, CA (US)

(72) Inventors: Sang Wook Kim, Palo Alto, CA (US); Zhibin Wang, Santa Clara, CA (US); Kyoungjin Lee, Santa Clara, CA (US); Byungkook Kong, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 69 days.

(21) Appl. No.: 15/853,243

(22) Filed: Dec. 22, 2017

(65) Prior Publication Data

US 2019/0198338 A1    Jun. 27, 2019

(51) Int. Cl.
| | | |
|---|---|---|
| *H01L 21/308* | (2006.01) | |
| *H01L 21/027* | (2006.01) | |
| *H01L 21/311* | (2006.01) | |
| *H01L 21/02* | (2006.01) | |
| *H01L 21/033* | (2006.01) | |

(52) U.S. Cl.
CPC ...... *H01L 21/3086* (2013.01); *H01L 21/0274* (2013.01); *H01L 21/02164* (2013.01); *H01L 21/02211* (2013.01); *H01L 21/0337* (2013.01); *H01L 21/311* (2013.01); *H01L 21/31116* (2013.01); *H01L 21/31144* (2013.01)

(58) Field of Classification Search
CPC ............... H01L 21/308; H01L 21/3086; H01L 21/3088
See application file for complete search history.

(56) References Cited

U.S. PATENT DOCUMENTS

| | | | | |
|---|---|---|---|---|
| 4,707,218 | A | * | 11/1987 | Giammarco ........ H01L 21/0337 216/46 |
| 4,776,922 | A | * | 10/1988 | Bhattacharyya .... H01L 21/0271 204/192.37 |
| 5,626,679 | A | * | 5/1997 | Shimizu ................. C23C 16/402 118/723 MR |
| 6,916,746 | B1 | | 7/2005 | Hudson et al. |
| 7,294,580 | B2 | | 11/2007 | Yun et al. |
| 7,683,447 | B2 | | 3/2010 | Wang et al. |
| 7,767,977 | B1 | | 8/2010 | Godet et al. |
| 7,888,653 | B2 | | 2/2011 | Kellerman et al. |
| 7,910,489 | B2 | | 3/2011 | Kim et al. |
| 8,101,510 | B2 | | 1/2012 | Godet et al. |
| 9,583,357 | B1 | | 2/2017 | Long et al. |
| 9,601,319 | B1 | | 3/2017 | Bravo et al. |
| 9,620,376 | B2 | | 4/2017 | Kamp et al. |

(Continued)

*Primary Examiner* — Thomas T Pham
(74) *Attorney, Agent, or Firm* — Patterson + Sheridan LLP

(57) ABSTRACT

Embodiments of the present disclosure generally provide a method and apparatus for forming features in a material layer utilizing EUV technologies. In one embodiment, a method of patterning a substrate includes disposing a patterned photoresist layer on a mask layer disposed on a substrate, wherein the patterned photoresist layer has openings with different widths defined in the patterned photoresist layer, forming a compensatory layer along sidewalls of the patterned photoresist layer to modify the widths of the openings and etching the mask layer through the openings with the modified width.

17 Claims, 11 Drawing Sheets

(56) References Cited

U.S. PATENT DOCUMENTS

| | | |
|---|---|---|
| 9,761,459 B2 | 9/2017 | Long et al. |
| 9,852,889 B1 | 12/2017 | Kellogg et al. |
| 9,881,820 B2 | 1/2018 | Wong et al. |
| 2003/0186561 A1* | 10/2003 | Law .................. C23C 16/402 438/788 |
| 2006/0009027 A1* | 1/2006 | Cheng .................. C23C 16/56 438/636 |
| 2006/0033137 A1* | 2/2006 | Lee .................. H01L 27/10852 257/296 |
| 2008/0070161 A1* | 3/2008 | Kim .................. C07C 309/00 430/287.1 |
| 2009/0278252 A1* | 11/2009 | Oikawa .............. H01L 23/293 257/702 |
| 2009/0286400 A1* | 11/2009 | Heo .................. H01L 21/0273 438/694 |
| 2012/0135273 A1 | 5/2012 | Horng et al. |
| 2012/0135543 A1 | 5/2012 | Shin et al. |
| 2014/0038311 A1 | 2/2014 | Kim et al. |
| 2015/0087149 A1* | 3/2015 | He .................. H01L 21/0338 438/696 |
| 2017/0018411 A1 | 1/2017 | Sriraman et al. |
| 2017/0069462 A1 | 3/2017 | Kanarik et al. |
| 2017/0110335 A1 | 4/2017 | Yang et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0178917 A1 | 6/2017 | Kamp et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0250056 A1 | 8/2017 | Boswell et al. |
| 2017/0263478 A1 | 9/2017 | McChesney et al. |
| 2017/0316935 A1 | 11/2017 | Tan et al. |
| 2017/0330786 A1 | 11/2017 | Genetti et al. |
| 2017/0334074 A1 | 11/2017 | Genetti et al. |
| 2017/0372912 A1 | 12/2017 | Long et al. |

* cited by examiner

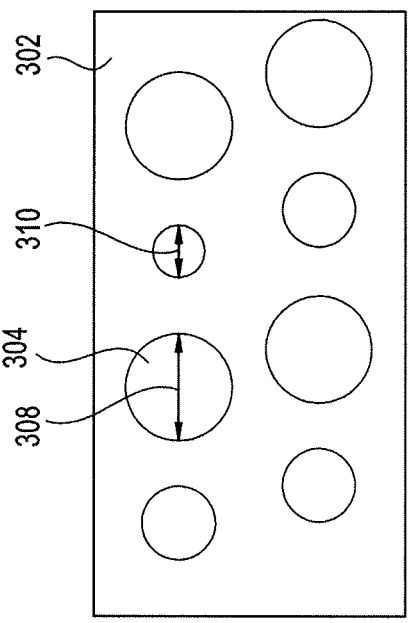
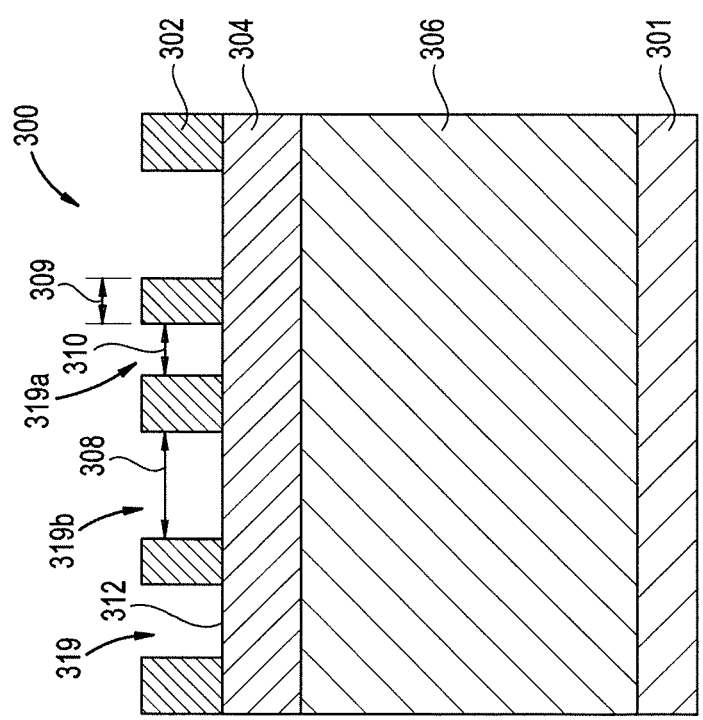
FIG. 3A
FIG. 3B

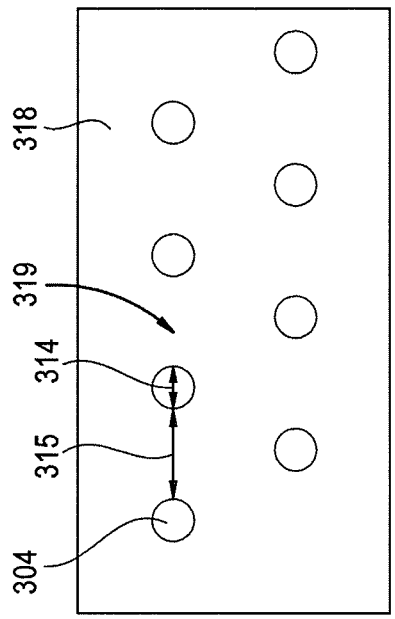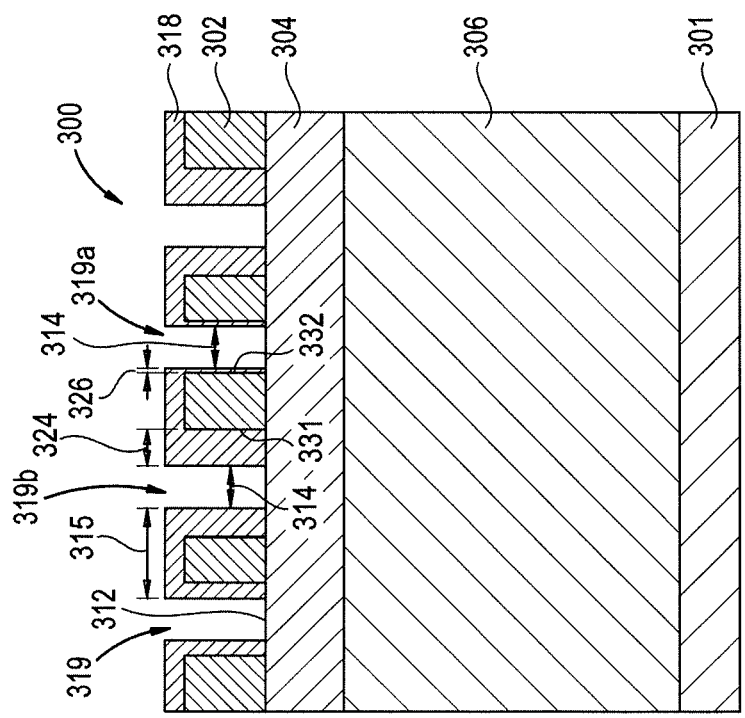
FIG. 4A
FIG. 4B

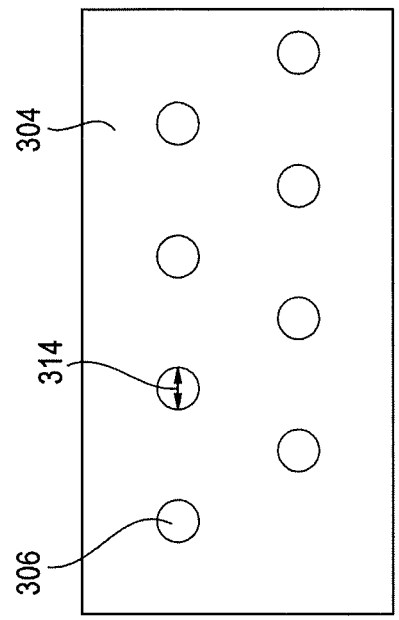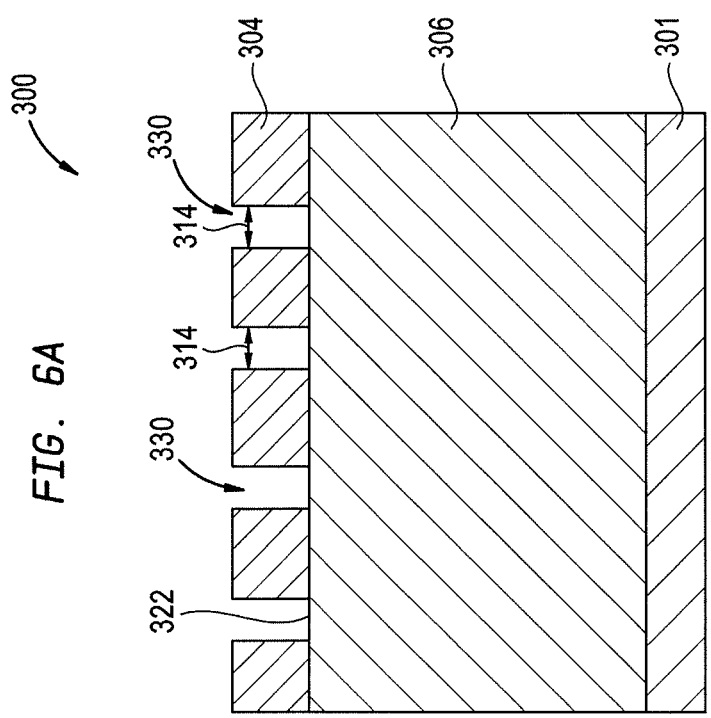

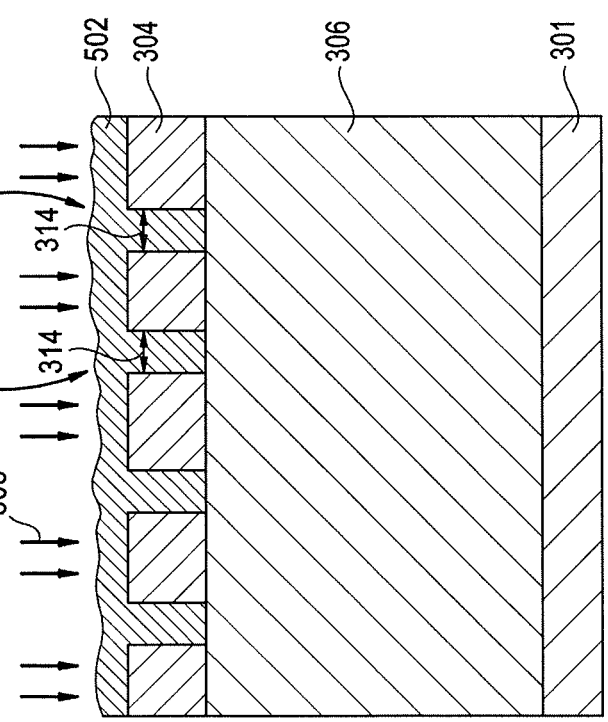
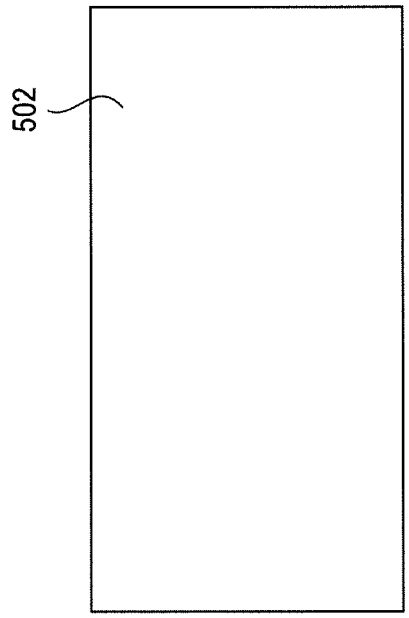

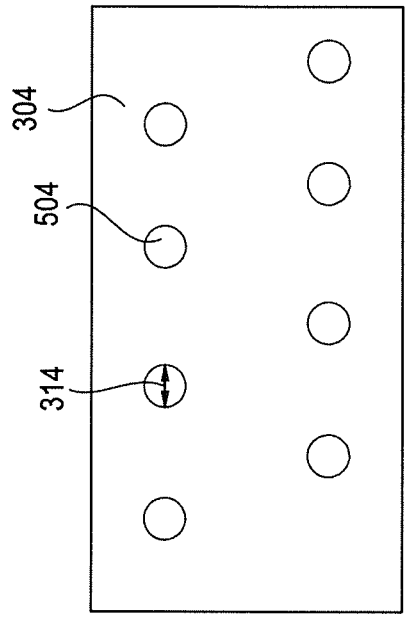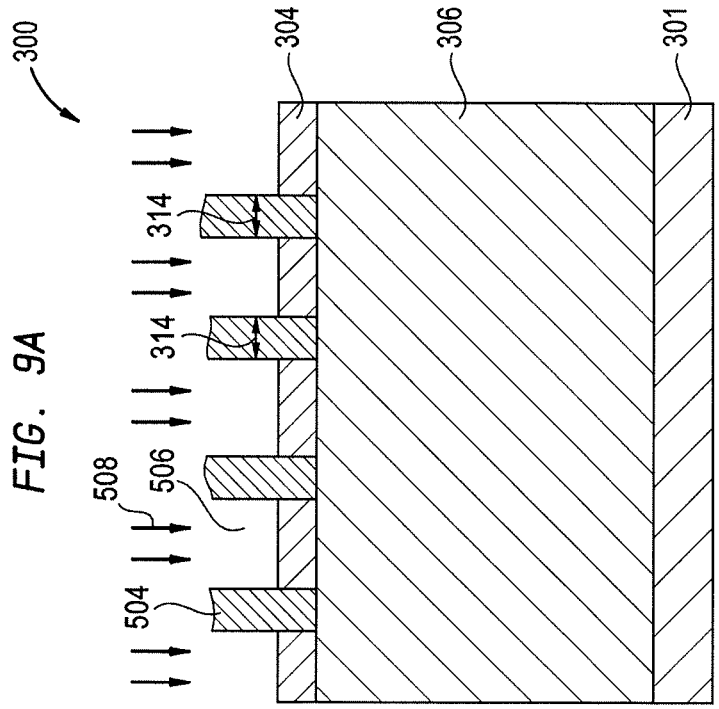

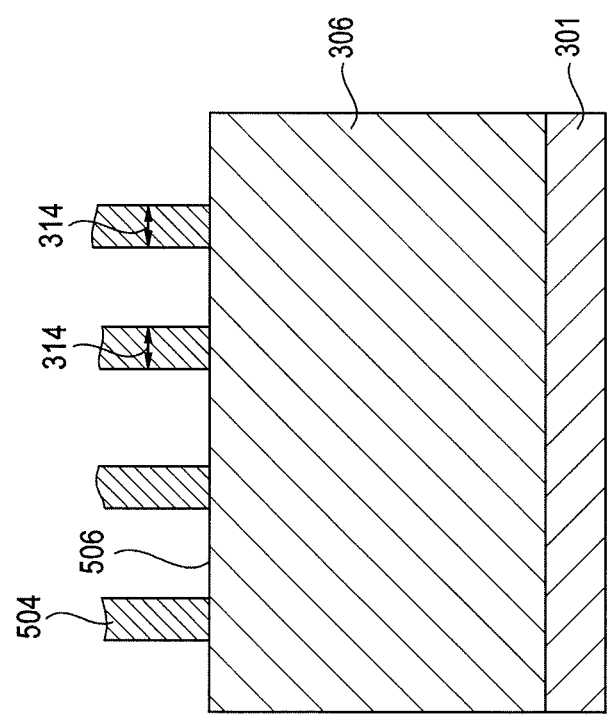
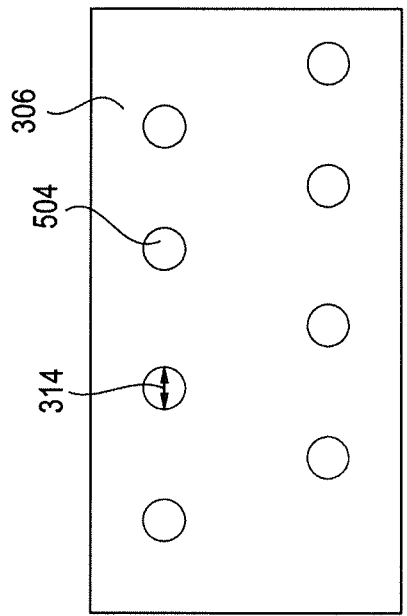

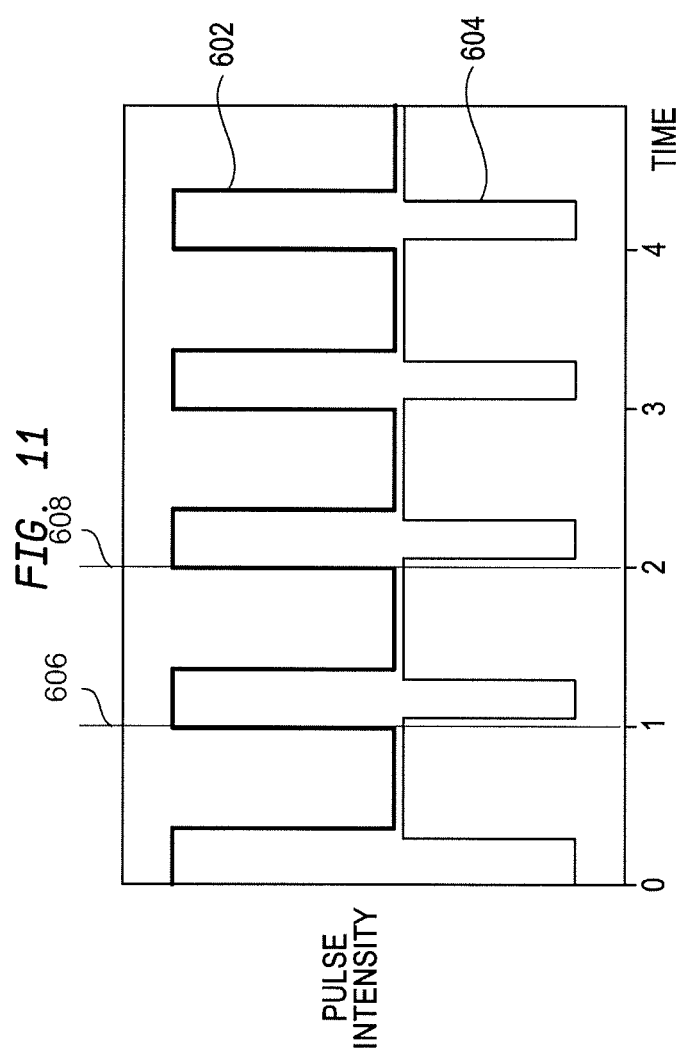

UNIFORM EUV PHOTORESIST PATTERNING UTILIZING PULSED PLASMA PROCESS

BACKGROUND

Field

Embodiments of the present disclosure generally relate to methods of forming features in a material layer with desired critical dimensions (CD). More specifically, embodiments of the disclosure related to methods of forming features in a material layer with desired critical dimensions (CD) utilizing extreme ultraviolet lithography (EUV) technology.

Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it is now necessary to use low resistivity conductive materials (e.g., copper) as well as low dielectric constant insulating materials (dielectric constant less than about 4) to obtain suitable electrical performance from such components.

The demands for greater integrated circuit densities also impose demands on the process sequences used in the manufacture of integrated circuit components. As the geometry limits of the structures used to form semiconductor devices are pushed against technology limits, the need for accurate pattern transfer for the manufacture of structures have small critical dimensions and high aspect ratios has become increasingly difficult. With the shrink of critical dimensions (CD), present optical lithography is approaching a technological limit at the 45 nanometer (nm) technology node with small features. Next generation lithography (NGL) is expected to replace the conventional optical lithography method, for example, in the 32 nm technology node and beyond. There are several NGL candidates, such as extreme ultraviolet lithography (EUVL), electron projection lithography (EPL), ion projection lithography (IPL), nano-imprint, and X-ray lithography. Among these, EUVL is the most likely successor due to the fact that EUVL has most of the properties of optical lithography, which is more mature technology as compared with other NGL methods.

While utilizing the extreme ultraviolet (EUV) manufacturing applications, an etching process is often used to transfer features into the material layer formed on a substrate. However, imprecise etch process control may result in CD bias, poor CD uniformity, undesired cross sectional profile, etch CD linearity and unwanted defects. In one etch process, known as dry etching, reactive ion etching, or plasma etching, a plasma is used to enhance a chemical reaction and etch the material layer on the substrate. Undesirably, conventional etch processes often exhibit etch bias due to attack on the photoresist material utilized to pattern the material layer. As the photoresist or sidewall of the film stack is attacked during the etching process, the critical dimension of patterned resist is not accurately transferred to the material layer. Thus, conventional etch processes may not produce acceptable results for material layers having CDs less than about 5 μm. This often results in non-uniformity of CD or mis-matched spacing among the features formed in the material layer. Thus, an etch process having high etch uniformity and substantially equal spacing of the features formed in a material layer to the film stack disposed on the photomask for EUV technology is highly desirable.

Furthermore, high etching selectivity among each layer disposed in the material layers is also desired. As the material layers formed on the substrate may have similar film properties, poor selectivity often occurs while etching each layer disposed in the material layers. Poor etching selectivity may result in poor structure integrity, such as non-uniformity or a tapered profile formed on the top and/or sidewall of the formed features on the substrate, thus eventually leading to device failure. Therefore, high selectivity of an etching process is increasingly important to preserve profiles and thickness of a photoresist layer while etching an underlying materials in the material layers or the like, disposed underneath the photoresist layer.

Thus, there is a need for an improved etch process for forming features in a material layer for EUV technology.

SUMMARY

Embodiments of the present disclosure generally provide a method and apparatus for forming features in a material layer utilizing EUV technologies. In one embodiment, a method of patterning a substrate includes disposing a patterned photoresist layer on a mask layer disposed on a substrate, wherein the patterned photoresist layer has openings with different widths defined in the patterned photoresist layer, forming a compensatory layer along sidewalls of the patterned photoresist layer to modify the widths of the openings and etching the mask layer through the openings with the modified width.

In another embodiment, a method for forming uniform patterned photoresist layer on a substrate includes forming a compensatory layer along sidewalls of a patterned photoresist layer to compensate critical dimension mismatch from the patterned photoresist layer and forming openings in the patterned photoresist layer with substantially the same width.

In yet another embodiment, a method for forming pillar type structures on a substrate includes forming a gapfill layer in openings defined by a patterned mask layer disposed on a substrate, the gapfill layer covering an upper surface of the patterned mask layer, and removing a portion of the gapfill layer above the upper surface of the patterned mask layer along with the gapfill layer formed in the openings defined by the patterned mask layer, and forming the pillar type structures on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A-3B, 4A-4B, 5A-5B and 6A-6B are respective cross-sectional and top views of the material layer disposed on a substrate during the etching process of FIG. 2;

FIGS. 8A-8B, 9A-9B and 10A-10B are respective cross-sectional and top views of the material layer disposed on a substrate during the etching process of FIG. 7; and FIG. 11 is a plot of a pulsed RF power intensity as a function of process time performed during the etching process of FIG. 2.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure provides methods for etching a material layer and/or a mask layer on a substrate to form features in the material layer and/or a mask layer with a high selectivity to the adjacent layers for manufacturing a structure for semiconductor devices. The material layer and/or the mask layer may be a single layer or a film stack including multiple layers. In one embodiment, the material layer and/or mask layer etching process utilizes a compensatory layer to modify the critical dimensions (CD) of a photoresist layer so that substantially equal spacing and/or critical dimensions between each patterned photoresist layer may be formed on the material layer and/or the mask layer prior to etching the material layer and/or the mask layer.

Figure 1:
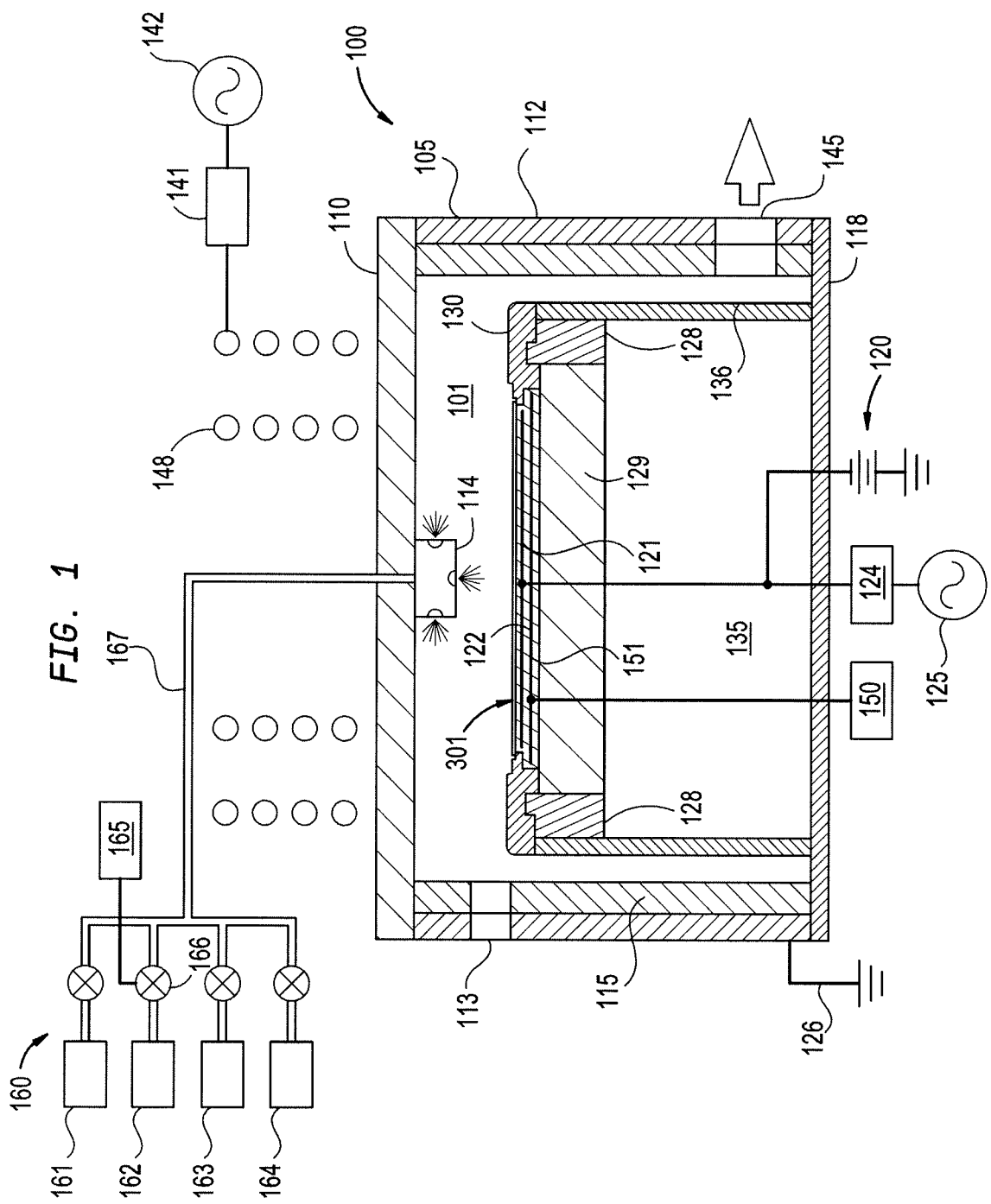
FIG. 1 is a schematic cross-sectional view of an exemplary plasma reactor in which at least one embodiment of the disclosure may be practiced.

FIG. 1 is a simplified cross-sectional view of an exemplary etching processing chamber 100 for etching a material layer. The exemplary etching processing chamber 100 is suitable for forming and removing one or more film layers from a substrate. One example of the process chamber that may be adapted to benefit from the disclosure is an AdvantEdge Mesa Etch processing chamber, available from Applied Materials, Inc., located in Santa Clara, Calif. Other suitable examples of the etching processing chamber for performing the disclosure include Decoupled Plasma Source (DPS), DPS-II, DPS-II AdvantEdge HT, DPS Plus, or DPS DT, Enabler, HART, a HART TS, and other different types of etching processing chambers. It is contemplated that other process chambers, including those available from other manufactures, may be adapted to practice embodiments of the disclosure.

The etching processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the etching processing chamber 100. The dimensions of the chamber body 105 and related components of the etching processing chamber 100 are not limited and generally are proportionally larger than the size of a substrate 301 to be processed therein. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewall 112 of the chamber body 105, facilitating the transfer of the substrate 301 into and out of the etching processing chamber 100. The access port 113 may be coupled to a transfer chamber and/or other chamber of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas, such as methane ($CH_4$), $CHF_3$, $CH_2F_2$, $CH_3F$, $C_4F_6$, carbon tetrafluoride ($CF_4$) and $C_4F_8$, halogen containing gas, such as sulfur hexafluoride ($SF_6$), hydrogen bromide (HBr) and chlorine ($Cl_2$), inert gas, such as argon gas (Ar) or helium (He), and other reacting gases, such as nitrogen ($N_2$), and oxygen gas ($O_2$). Additionally, process gasses may include chlorine, fluorine, oxygen and hydrogen containing gases such as $BCl_3$, $C_4F_8$, $O_4F_6$, $CHF_3$, $CH_2F_2$, $CH_3F$, $NF_3$, $CO_2$, $SO_2$, CO, and $H_2$ among others.

Valves 166 control the flow of the process gases from the sources 161, 162, 163, 164 from the gas panel 160 and are managed by a controller 165. The flow of the gases supplied to the chamber body 105 from the gas panel 160 may include combinations of the gases.

The lid assembly 110 includes a nozzle 114. The nozzle 114 has one or more ports for introducing the process gases from the sources 161, 162, 164, 163 of the gas panel 160 into the chamber volume 101. After the process gases are introduced into the etching processing chamber 100, the gases are energized to form plasma. An antenna 148, such as one or more inductor coils, may be provided adjacent to the etching processing chamber 100. An antenna power supply 142 is coupled to the antenna 148 through a match circuit 141 to inductively couple energy, such as RF energy, to the process gas to maintain a plasma formed from the process gas in the chamber volume 101 of the etch processing chamber 100. Alternatively, or in addition to the antenna power supply 142, process electrodes below the substrate 301 and/or above the substrate 301 may be used to capacitively couple RF power to the process gases to maintain the plasma within the chamber volume 101. The operation of the power supply 142 may be controlled by a controller, such as controller 165, that also controls the operation of other components in the etching processing chamber 100.

A substrate support assembly 135 is disposed in the chamber volume 101 to support the substrate 301 during processing. The substrate support assembly 135 may include an electrostatic chuck 122 for holding the substrate 301 during processing. The electrostatic chuck (ESC) 122 uses electrostatic attraction to hold the substrate 301 to the substrate support assembly 135. The ESC 122 is powered by an RF power supply 125 integrated with a match circuit 124. The ESC 122 comprises an electrode 121 embedded within a dielectric body. The RF power supply 125 may provide a RF bias voltage of about 200 volts to about 3000 volts to the electrode 121. The RF power supply 125 may also be a DC or pulsed DC source. The RF power supply 125 is coupled to the controller 165 for controlling the operation of the electrode 121.

A voltage power generator 120 is coupled to the electrode 121 or other electrode within the substrate support assembly 135. The voltage power generator 120 may facilitate supplying a voltage to the electrode 121. The voltage supplied to the electrode 121 may establish an electrical potential that controls profile and plasma distribution across the surface of the substrate support assembly 135. Applying a voltage, either positive or negative, to the substrate support assembly 135 during processing is believed to assist controlling of the distribution or profile of ions, charges, radicals and electrons from the plasma across the surface of the substrate 301 disposed on the substrate support assembly 135. In one embodiment, the voltage power generator 120 may supply a high voltage power, such as greater than 50 Watts, to the electrode 121 during processing. For example, during a process, particular for a cleaning process, a high voltage power, such as between about 500 Watts and about 5000 Watts, may be supplied to the substrate support assembly 135 as needed.

The ESC 122 may optionally include heaters 151 disposed therein that are connected to a power source (not shown), for heating the substrate. A cooling base 129 supporting the ESC 122 includes conduits for circulating a heat transfer fluid to maintain a temperature of the ESC 122 and substrate 301 disposed thereon. The cooling base 129 is provided to assist in controlling the temperature of the substrate 301. The ESC 122 and the cooling base 129 are configured to perform in the temperature range required by the thermal budget of the device being fabricated on the substrate 301. For example, the ESC 122 and the cooling base 129 may be configured to maintain the substrate 301 at a temperature of about minus about 25 degrees Celsius to about 500 degrees Celsius for certain embodiments. In one embodiment, the temperature of the substrate 301 is maintained throughout subsequent etch processes at about 70 to 90 degrees Celsius. To mitigate process drift and time, the temperature of the substrate 301 may be maintained substantially constant by the cooling base 129 throughout the time the substrate 301 is in the etch chamber.

A cover ring 130 is disposed on the ESC 122 and along the periphery of the substrate support assembly 135. The cover ring 130 is configured to confine etching gases to a desired portion of the exposed top surface of the substrate 301, while shielding the top surface of the substrate support assembly 135 from the plasma environment inside the etch processing chamber 100. Lift pins (not shown) are selectively moved through the substrate support assembly 135 to lift the substrate 301 above the substrate support assembly 135 to facilitate access to the substrate 301 by a transfer robot (not shown) or other suitable transfer mechanism.

The controller 165 may be utilized to control the process sequence, regulating the gas flows from the gas panel 160 into the etching processing chamber 100 and other process parameters. Software routines, when executed by a CPU of the controller 165, transform the controller 165 into a specific purpose computer (controller) that controls the etch processing chamber 100 such that the processes are performed in accordance with the present disclosure. The software routines may also be stored and/or executed by a second controller (not shown) that is collocated with the etching processing chamber 100.

The substrate 301 has various film layers disposed thereon which may include at least one dielectric layer. The various film layers may require etch recipes which are unique for the different compositions of the other material layers in the substrate 301. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etch processing chamber or across several etch processing chambers. Each etch processing chamber may be configured to etch with one or more of the etch recipes. In one embodiment, etch processing chamber 100 is configured to at least etch a metal layer to form an interconnection structure. For processing parameters provided herein, the etch processing chamber 100 is configured to process a 300 or 450 diameter substrate. The process parameters, such as flow and power, may generally be scaled proportionally with the change in the chamber volume or substrate plan area.

FIG. 1 only shows one exemplary configuration of various types of plasma reactors that can be used to practice the disclosure. For example, different types of RF source power and RF bias power can be coupled into the plasma chamber using different coupling mechanisms. Using both the source power and the bias power allows independent control of a plasma density and a bias voltage of the substrate with respect to the plasma. In some applications, the plasma may be generated in a different chamber from the one in which the substrate is located, e.g., remote plasma source, and the plasma subsequently guided into the chamber using techniques known in the art.

Figure 2:
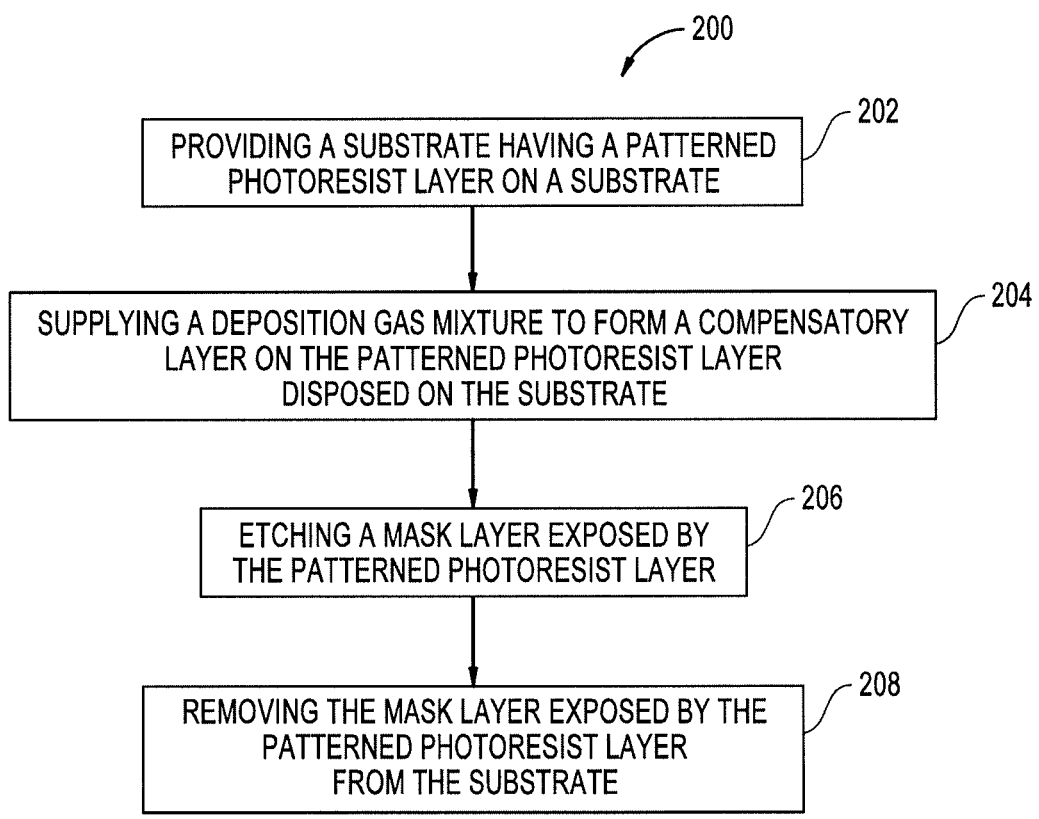
FIG. 2 is a flow diagram of one embodiment of an etching process according to one embodiment of the disclosure.

FIG. 2 illustrates a process sequence 200 used to perform an etching process to etch a mask layer disposed on a material layer on a substrate with high etching selectivity. The sequence described in FIG. 2 corresponds to the fabrication stages depicted in FIGS. 3A-6B which illustrates schematic cross-sectional views of a substrate 301 having a film stack 300 formed thereon. FIGS. 3A-6B illustrate different stages of etching the film stack 300 including a mask layer 304 formed on a material layer 306 disposed on the substrate 301.

The process sequence 200 starts at operation 202 by transferring a substrate, such as the substrate 301 depicted in a cross section view of FIG. 3A and a top view of FIG. 3B, into the processing chamber, such as the processing chamber 100 depicted in FIG. 1, or other suitable processing chamber. The substrate 301 may have a substantially planar surface, an uneven surface, or a substantially planar surface having a film stack 300, or structures, formed thereon. The substrate 301 shown in FIG. 3A includes the film stack 300 formed on the substrate 301. In one embodiment, the substrate 301 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 301 may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

In one embodiment, the film stack 300 may include the mask layer 304 formed on a material layer 306. The material layer 306 may be a target material that may have features transferred thereto through the mask layer 304. Alternatively, the material layer 306 may be an additional mask layer that may serve as an additional etching mask material to transfer features into other layers (not shown) disposed between the substrate 301 and the material layer 306 as needed. In the example depicted in FIG. 3A-3B, the mask layer 304 is a dielectric layer having a first material and the material layer 306 is also a dielectric layer having a second material different from the first material. The mask layer 304 and the material layer 306 both serve as etching masks during an etching process to transfer features into the substrate 301 or additional layers (not shown) formed between the substrate 301 and the material layer 306 as needed.

In one example, the first material selected from the mask layer 304 is an ARC layer fabricated from a group consisting of silicon oxide, silicon nitride, silicon oxynitride, silicon carbide, amorphous carbon, doped amorphous carbon, titanium nitride, titanium oxynitride, combinations thereof and the like. In the example wherein the material layer 306 is configured as another etching mask layer, the second material selected for the material layer 306 may also be selected from the group consisting of silicon oxide, silicon nitride, silicon oxynitride, silicon carbide, amorphous carbon, doped amorphous carbon, titanium nitride, titanium oxynitride, combinations thereof (same group of the materials for the mask layer 304) and the like, but different from the first materials selected for the mask layer 304. In one example, the first material selected for the mask layer 304 is a silicon oxide material and the second material selected for the material layer 306 is carbon containing material, such as amorphous carbon, carbide, and the like. In another example wherein the material layer 306 is not utilized as an etching mask layer (e.g., a structure configured to be part of a semiconductor device), the material layer 306 may be a metal layer, a dielectric layer, or a structure of combinations thereof selected from a group consisting of silicon oxide, TEOS oxide, USG, SOG, or organic silicon and oxide containing material, cobalt, copper, aluminum, tungsten, ruthenium, combinations thereof, and the like. In one particular example, the material layer 306 may include metal materials laterally bounded by a dielectric layer that may be utilized to form a gate structure, a contact structure, or a front-end or back-end interconnection structures for semiconductor devices as needed.

A patterned photoresist layer 302, such as a photoresist layer for extreme ultraviolet (EUV) applications, is formed on the mask layer 304. The patterned photoresist layer 302 is an organic resist layer. The photoresist layer 302 may be patterned by suitable technologies to form openings 319 (also shown as 319a, 319b) in the patterned photoresist layer 302.

In the example depicted in FIGS. 3A and 3B, as the widths 308, 310 of the openings 319 formed among the patterned photoresist layer 302 becomes small in advanced technology, unequal widths 308, 310 (e.g., inaccurate critical dimensions 309 of the photoresist layer 302) may be found after the EUV lithographic process. Inaccurate control or low resolution of the lithography exposure process may cause in poor critical dimension control of the patterned photoresist layer 302, resulting in line width roughness (LWR), which may also lead to unequal widths 308, 310 among different openings 319a, 319b formed in the patterned photoresist layer 302. Undesired profile and inaccurate critical dimensions of the photoresist layer 302 may result in inaccurate feature transfer to the mask layer 304 and even further down to the material layer 306, thus, eventually leading to device failure and yield loss. As shown in the top view depicted in FIG. 3B, the surface 312 of the mask layer 304 exposed by the openings 319 may have different exposed surface areas as the openings 319 formed in the patterned photoresist layer 302 may have different widths 308, 310 among different openings 319.

At operation 204, a deposition gas mixture is supplied to the substrate 301 disposed in the processing chamber 100 as depicted in FIG. 1. The deposition gas mixture forms a compensatory layer 318 on the surfaces of the patterned photoresist layer 302, as shown in FIGS. 4A-4B. In the cross sectional view of the patterned photoresist layer 302, as shown in FIG. 4A, the compensatory layer 318 is formed on the outer surface of the patterned photoresist layer 302 to alter or modify the width of the openings 319 formed among the patterned photoresist layer 302, so as to provide substantially equal width (e.g., substantially same width in each opening 319 or same critical dimensions 315 of the patterned photoresist layer 302) between each patterned photoresist layer 302. For example, in the openings 319b with relatively a wider width 308 (as shown in FIG. 3A), a relatively thicker thickness of compensatory layer 318 may be formed in such opening 319b (e.g., narrowing the width of the opening 319b), as shown in FIG. 4A, so that the resultant openings 319b, 319b formed in the patterned photoresist layer 302 may substantially have equal width 314 by the thickness supplement from the compensatory layer 318.

It is noted that a loading effect is often found in small dimension features (e.g., openings), which is a measure of the variation in critical dimensions between regions of high and low feature density. The low feature density regions (e.g., isolated regions) receive more reactive species per unit surface area compared to the high feature density regions (e.g., dense regions) due to larger total expose of surface area in the dense regions, thus resulting in a higher reaction rate (e.g., deposition rate) in the low density regions. The sidewall thickness of the compensatory layer 318 generated from the reactive species exhibited the similar pattern density dependence where more compensatory layer (e.g., passivation or sidewall deposition) is formed for the isolated features due to more reactive species being generated and received in the low feature density region. The difference in reactive species and the passivation per surface area between these two regions increases as feature density difference increase. Thus, by utilizing the loading effect, the openings 319b with wider width 308 may receive relatively more reactive species than the openings 319a with relatively narrower width 310, as shown in FIG. 3A, thus forming the compensatory layer 318 with relative higher thickness 324 in the openings 319b, as shown in FIG. 4A. As a result, different widths, 308, 310 of the openings 319a, 319b may then be compensated or balanced out by forming the compensatory layer 318 with different sidewall thickness 324, 326 at the regions with different densities. The loading effect thus assists forming the compensatory layer 318 with different sidewall thickness at different regions of the patterned photoresist layer 302 so as to provide resultant openings 319 with substantially equal width 314, as shown in FIG. 4A. As also shown in the top view of FIG. 4B, the openings 319 may then have similar width 314 across the patterned photoresist layer 302 and each patterned photoresist layer 302 may then have substantially similar critical dimension 315 due to the thickness supplement from the compensatory layer 318.

In one example, the compensatory layer 318 is a dielectric layer. The deposition gas mixture supplied to form the compensatory layer 318 may include a silicon containing gas and an oxygen containing gas. Suitable examples of the silicon containing gas include $SiCl_4$, $SiF_4$, $Si_2Cl_6$, and the like. Suitable examples of the oxygen containing gas include $NO_2$, $N_2O$, $CO$, $CO_2$, $O_2$, and the like. In one specific example, the silicon containing gas is $SiCl_4$ and the oxygen containing gas is $O_2$ and the compensatory layer 318 is a silicon oxide layer.

During deposition, several process parameters may also be regulated. In one exemplary embodiment, a process pressure in the processing chamber 100 is regulated between about 10 mTorr and about 5000 mTorr, such as between about 10 mTorr and about 200 mTorr. A RF source and/or bias power may be utilized while forming the compensatory layer 318. The RF source and the RF bias power may be applied to the processing chamber utilizing non-synchronized pulses. It is believed the pulses of the RF source and bias powers may assist the trajectory of reactive species to be distributed across the substrate surface, assisting forming the compensatory layer 318 at the dense and isolated regions across the patterned photoresist layer 302. In one example, the RF source and bias power at a frequency of about 13 MHz may be applied to maintain a plasma in the deposition gas mixture. For example, a RF source and RF bias power of about 20 Watts to about 200 Watts may be applied to maintain a plasma inside the processing chamber 100. The deposition gas mixture may be flowed into the chamber at a rate between about 200 sccm to about 800 sccm. A substrate temperature is maintained between about 25 degrees Celsius to about 300 degrees Celsius, such as between about 50 degrees Celsius and about 140 degrees Celsius, for example between about 50 degrees Celsius and about 110 degrees Celsius.

In one example, the RF bias power and the RF source power may be pulsed in the processing chamber 100 during the compensatory layer deposition process at operation 204. The RF bias power and the RF source power may be synchronized or non-synchronized pulsed into the processing chamber. In one example, the RF bias power and the RF source power are non-synchronized pulsed into the processing chamber. For example, the RF source power may be pulsed to the processing chamber prior to pulsing the RF bias power. FIG. 11 depicts pulsed RF power intensity as a function of process time. The trace line 602 indicates the intensity of the RF source power pulsed into the processing chamber and the trace line 604 indicates the intensity of the RF bias power pulsed into the processing chamber while forming the compensatory layer 318. For each time period, as shown in the lines 606 and 608 between the time units 1 and 2, the RF source power, as shown in the trace line 602, is pulsed into the processing chamber prior to the pulsing of the RF bias power, as shown in the trance line 604, in each pulsing cycle. For example, the RF bias power is pulsed about 70% delay with respect to the RF source power. In one example, the RF source power is pulsed about 75% of each duty cycle and the RF bias power is pulsed about 35% of each duty cycle. Each duty cycle, for example between each time unit in FIG. 11, is between about 0.1 millisecond (ms) and about 10 (ms).

As discussed above, by utilizing the loading effect, the compensatory layer 318 formed on two sidewalls 331, 332 of the patterned photoresist layer 302 may have different thickness 324, 326, as shown in FIG. 4A. Thus, by forming the compensatory layer 318 with different thicknesses 324, 326 at different locations of the patterned photoresist layer 302, the openings 319 with uniform widths 314 may be obtained. It is believed that by utilizing pulsing of the RF source and bias power, a relatively mild or gentle deposition process may be obtained so as to form the compensatory layer 318 on sidewalls 331, 332 of the patterned photoresist layer 302 is a desired manner, based on the feature densities formed at different regions of the patterned photoresist layer 302, so as to form the patterned photoresist layer 302 with consist and desired critical dimension (CD) 315, with the thickness compensation from the compensatory layer 318. In other words, by periodically pulsing RF source and bias power during the deposition process, the deposition process and a pump/purge process may be controlled to form the compensatory layer 318 with desired profiles and dimensions.

Figure 5B:
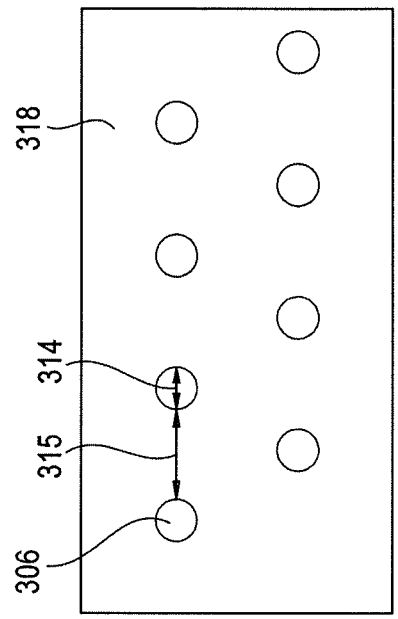
Figure 5A:
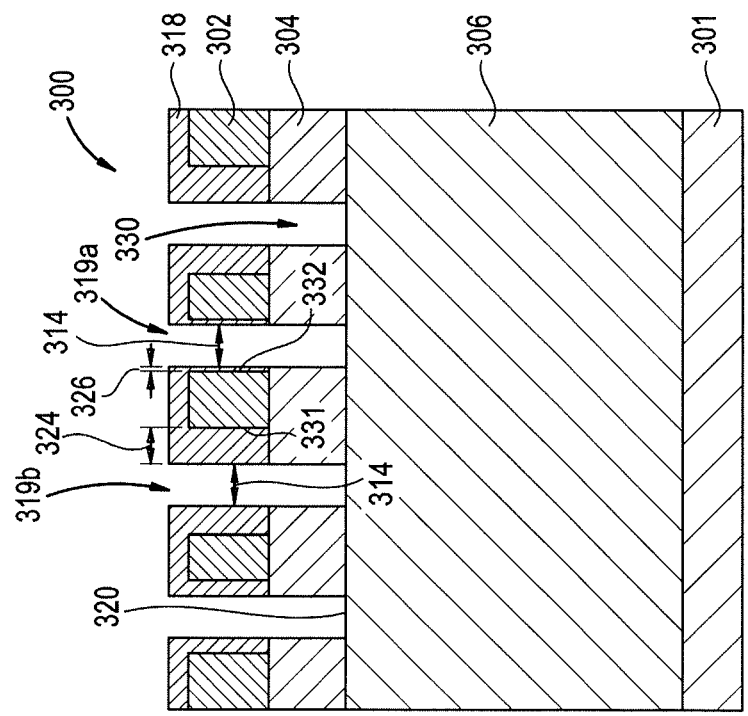

At operation 206, after the compensatory layer 318 is formed, an etching gas mixture is then supplied into the processing chamber to etch the mask layer 304 exposed by the opening 319 defined by the patterned photoresist layer 302 along with the compensatory layer 318, as shown in FIG. 5A-5B. The etching gas mixture includes at least one carbon fluorine containing gas or a halogen containing gas to etch the mask layer 304. Suitable examples of the carbon fluorine containing gas include $CF_4$, $CHF_3$, $CH_2F_2$, $CH_3F$, $C_4F_6$, and $C_4F_8$. Suitable examples of the halogen containing gas include $NF_3$, $SF_6$, $Cl_2$, $HF$, $Si_2Cl_6$, $SiCl_4$, $HBr$, $HCl$ and the like. An inert gas may also be supplied into the etching gas mixture to assist the profile control as needed. Examples of the inert gas supplied in the gas mixture include Ar, He, Ne, Kr, Xe or the like. In one embodiment, the fluorine-carbon containing gas supplied in the etching gas mixture includes $CF_4$, $C_4F_6$ or $C_4F_8$. The fluorine-carbon containing gas may be maintained at a flow rate between about 30 sccm and about 300 sccm.

While supplying the etching gas mixture into the processing chamber, RF source and bias powers may be then applied in the etching gas mixture to form a plasma. In one embodiment, the RF source power applied in the etching gas mixture may include providing RF source power and a RF bias power at a desired frequency level, such as 13.56 MHz and/or 2 MHz. During processing, the processing gases in the etching gas mixture may be dissociated as reactive etchants by the plasma formed from the etching gas mixture. The fluorine ions dissociated from fluorine-carbon containing gas and/or the halogen containing gas in the etching gas mixture react with and attack the mask layer 304 through the opening 319 defined by the patterned photoresist layer 302 and the compensatory layer 318. It is believed that the RF source power may assist dissociating the processing gas from the etching gas mixture into reactive species while the RF bias power may assist providing directionality to the plasma generated during the etch process.

In one example, the RF source power may be synchronized or non-synchronized pulsed or continuously applied with the RF bias power. An anisotropic etch process is performed to extend the openings 319 further into the mask layer 304 to form openings 330 in the mask layer 304, until an surface 320 of the underlying material layer 306 is exposed, as shown in FIGS. 5A-5B. The energy level generated from the RF source power and the RF bias power may be provided at a predetermined ratio so as to improve feature verticality and enhances accuracy for the feature CD transfer defined from the patterned photoresist layer 302 and the compensatory layer 318 to the mask layer 304.

It is noted that the deposition process at operation 204 and the etching process at operation 206 may be performed in a single chamber, such as the etching chamber 100 depicted in FIG. 1 or in separate chambers as needed for different process requirements and manufacturing arrangements.

At operation 208, after the mask layer 304 is etched and the openings 319 is formed in the mask layer 304, the patterned photoresist layer 302 and the compensatory layer 318 is then removed from the substrate 301, as shown in FIGS. 6A-6B. The mask layer 304 and the compensatory layer 318 may be removed by an ashing process, an etching process or any suitable photoresist removal process. The removal process may be an isotropic etching process to remove the patterned photoresist layer 302 and the compensatory layer 318 and/or other related compounds from the substrate 301.

After the openings 330 is formed in the mask layer 304, the mask layer 304 may be further utilized to form another types of mask features, such as pillar type structures, to serve as an etching mask to further transfer features into the underlying material layer 306. Details of forming pillar type structures as an etching mask is further described below in process sequence 700 in FIG. 7 with referenced to the FIGS. 8A-10B.

Figure 7:
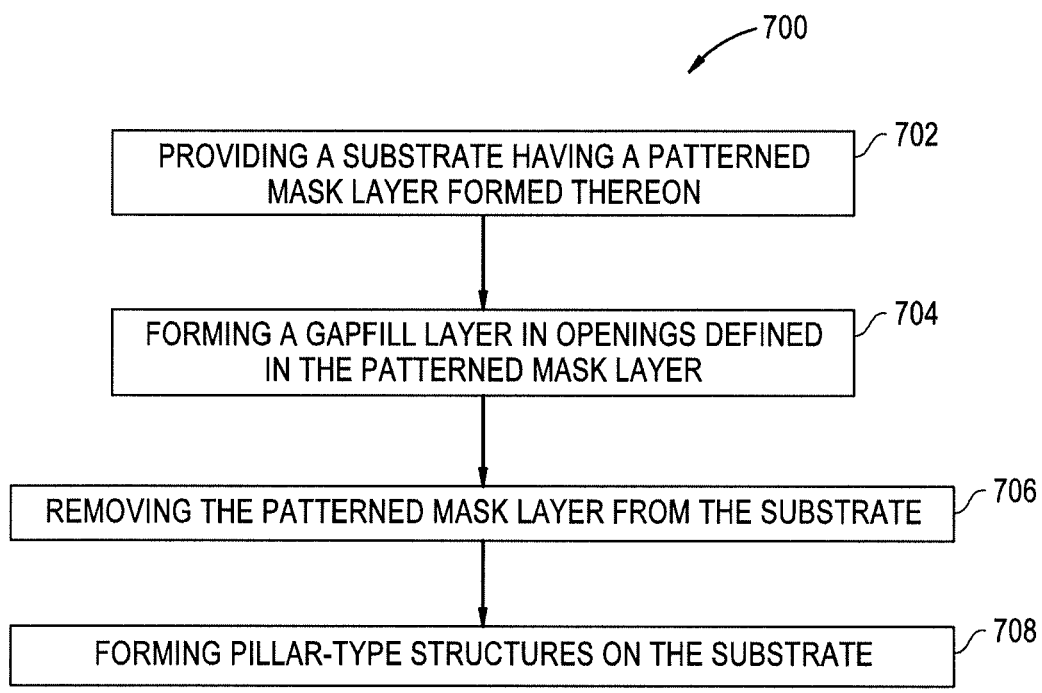
FIG. 7 is a flow diagram of one embodiment of an etching process according to one embodiment of the disclosure.

FIG. 7 illustrates a process sequence 700 used to convert the patterned mask layer 304 into pillar type structures, which may be utilized to further transfer features into the underlying material layer 306. The sequence described in FIG. 7 corresponds to the fabrication stages depicted in FIGS. 8A-10B, which illustrates schematic cross-sectional views of a substrate 301 having the patterned mask layer 304 manufactured from the process 200 described above from FIGS. 6A-6B. FIGS. 8A-10B illustrate different stages of converting the patterned mask layer 304 into pillar type structures on the material layer 306 disposed on the substrate 301.

The process sequence 700 starts at operation 702 by providing the substrate 301 having the patterned mask layer 304 formed from the process 200 described above with reference to FIGS. 6A-6B. It is noted that the patterned mask layer 304 may also be fabricated by any suitable process available to have the process sequences 700 performed thereon so as to convert the patterned mask layer 304 into pillar type structures as needed.

At operation 704, a gapfill layer 502 is formed in the openings 330 of the mask layer 304, as shown in a cross sectional view of FIG. 8A and a top view of FIG. 8B. The gapfill layer 502 may be formed in any suitable deposition techniques, such as CVD, ALD, flowable CVD, spin-coatings, and PVD. The gapfill layer 502 is a dielectric material selected from a group consisting of silicon oxide, silicon nitride, silicon oxynitride, silicon carbide, amorphous carbon, doped amorphous carbon, titanium nitride, titanium oxynitride, the combinations thereof and the like. The gapfill layer 502 is fabricated from a dielectric material different from the mask layer 304. For example, in the embodiment wherein the mask layer 304 is an amorphous carbon material, the gapfill layer 502 may be fabricated from a silicon containing material, such as $SiO_2$, SiN, SiON, SiC or the like. Different types of the materials selected to fabricate the gapfill layer 502 and the mask layer 304 may assist promoting etching selectivity in the later patterning/etching process. In the example depicted in FIGS. 8A-8B, the gapfill layer 502 is a silicon oxide layer and the mask layer 304 is a silicon nitride layer.

As discussed above, the openings 330 formed in the patterned mask layer 304 has substantially equal width 314. Thus, the gapfill layer 502 in the patterned mask layer 304 may also be formed in a substantially equal deposition rate.

At operation 706, after the gapfill layer 502 is formed, an etching process is then performed to remove portions of the gapfill layer 502 along with the patterned mask layer 304, as shown in FIGS. 9A-9B. Reactive species from the plasma generated during the etching process are controlled in a manner that predominately etches the gapfill layer 502 above the patterned mask layer 304 and the underlying patterned mask layer 304, as indicated by the arrow 508 in FIGS. 8A and 9A, without substantially damaging the gapfill layer 502. As depicted in FIG. 9A, while the etching process continues to etch further down to the patterned mask layer 304, openings 506 are then defined by pillar type structures 504 formed from patterning the gapfill layer 502. Thus, the globally formed gapfill layer 502, as shown in the top view of FIG. 8B, is then patterned and formed into the pillar type structures 504 isolated formed spaced apart from each other, as shown in FIG. 9B. It is noted that additional lithographic or etching process may be utilized to assist etching the gapfill layer 502 at certain locations of the substrate with certain directionality without damaging the gapfill layer at other locations.

In one example, the gapfill layer 502 may be etched by suitable etchants selected from the carbon fluorine containing gas or a halogen containing gas, as described above.

At operation 708, the etching process is continuously performed until the patterned mask layer 304 is removed from the substrate, forming the pillar type structures 504 with desired uniform width 314 on the material layer 306, as shown in FIG. 10A-10B. Thus, by removing (e.g., replacing) the patterned mask layer 304 with the gapfill layer 502, the pillar type structures 504 may be obtained with desired width 314 and profile to help further transfer features into the underling material layer 306.

Thus, the present application provides methods for forming features in a material layer utilizing EUV technologies for semiconductor applications. The methods are performed by forming a compensatory layer to compensate and modify the un-equal critical dimensions (CD) from the patterned EUV photoresist layer. With the assistance from the thickness compensation from the compensatory layer, a patterned mask layer with substantially similar width or critical dimensions (CD) may be obtained. Additionally, the patterned mask layer may later be replaced with pillar type structures to assist transferring features with desired profiles further into another layer disposed on the substrate.

While the foregoing is directed to embodiments of the present disclosure, other and further embodiments of the disclosure may be devised without departing from the basic scope thereof, and the scope thereof is determined by the claims that follow.

What is claimed is:

1. A method of patterning a substrate, comprising:
positioning a substrate having a film stack thereon in a processing chamber, wherein the film stack comprises a mask layer on the substrate and a patterned photoresist layer on the mask layer, and the patterned photoresist layer has a first opening having a first width and a second opening having a second width defined in the patterned photoresist layer, the first width being greater than the second width;
supplying a deposition gas mixture to the substrate disposed in the processing chamber and applying a first RF source power pulse and a first RF bias power pulse into the processing chamber to maintain a plasma in the deposition gas mixture and form a compensatory layer along sidewalls of the first and second openings, wherein the compensatory layer on the sidewalls of the first opening is thicker than the compensatory layer on the sidewalls of the second opening; and
supplying an etching gas mixture into the processing chamber and applying a second RF source power pulse and a second RF bias power pulse to form a plasma and etch the mask layer through the first and second openings having the compensatory layer formed on the sidewalls thereof, wherein the compensatory layer is a silicon oxide layer.

2. The method of claim 1, wherein the first and second openings having the compensatory layer formed on the sidewalls thereof have substantially the same width.

3. The method of claim 1, wherein the deposition gas mixture comprises a silicon containing gas and an oxygen containing gas.

4. The method of claim 1, wherein the compensatory layer is formed from a first material different from a second material selected to form the mask layer.

5. The method of claim 1, wherein the compensatory layer and the mask layer are both dielectric layers.

6. The method of claim 1, wherein the substrate further comprises a material layer disposed between the mask layer and the substrate.

7. The method of claim 6, wherein the material layer is fabricated from a dielectric material different from the mask layer.

8. The method of claim 1, further comprising:
forming a gapfill layer in the first and second openings defined in the patterned photoresist layer and covering an upper surface of the etched mask layer.

9. The method of claim 8, further comprising:
etching a portion of the gapfill layer formed in the first and second openings defined in the patterned photoresist layer; and
forming pillar type structures on the substrate.

10. The method of claim 9, wherein the pillar type structures formed on the substrate have substantially similar width.

11. The method of claim 8, wherein the gapfill layer is fabricated from a dielectric layer different from the mask layer.

12. The method of claim 1, wherein the patterned photoresist layer is an organic resist layer used for EUV applications.

13. The method of claim 1, wherein the first RF source power pulse and the first RF bias power pulse are applied at a frequency of about 13 MHz and a bias power of about 20 Watts to about 200 Watts.

14. A method for forming uniform patterned photoresist layer on a substrate within a processing chamber, comprising:
supplying a deposition gas mixture to the substrate within the processing chamber and applying a first RF source power pulse and a first RF bias power pulse into the processing chamber to maintain a plasma in the deposition gas mixture and form a compensatory layer on sidewalls of a plurality of non-uniform width openings of a patterned photoresist layer, wherein the compensatory layer formed on the sidewalls of wider openings is thicker than the compensatory layer formed on the sidewalls of narrower openings; and
supplying an etching gas mixture into the processing chamber and applying a second RF source power pulse and a RF second bias power pulse to form a plasma and form a plurality of uniform width openings in the patterned photoresist layer having the compensatory layer formed on the sidewalls thereof, wherein
the compensatory layer is a silicon oxide layer.

15. The method of claim 14, wherein the patterned photoresist layer is organic resist layer used for EUV applications.

16. The method of claim 14, wherein the deposition gas mixture comprises a silicon containing gas and an oxygen containing gas.

17. The method of claim 14, wherein the first RF source power pulse and the first RF bias power pulse are applied at a frequency of about 13 MHz and a bias power of about 20 Watts to about 200 Watts.

* * * * *

UNITED STATES PATENT AND TRADEMARK OFFICE
CERTIFICATE OF CORRECTION

PATENT NO. : 10,727,075 B2
APPLICATION NO. : 15/853243
DATED : July 28, 2020
INVENTOR(S) : Sang Wook Kim et al.

Page 1 of 1

It is certified that error appears in the above-identified patent and that said Letters Patent is hereby corrected as shown below:

In the Specification

In Column 3, Line 2, after "disclosure;" delete "and".

In Column 4, Line 32, delete "$O_4F_6$," and insert -- $C_4F_6$, --, therefor.

In the Claims

In Column 14, Line 13, in Claim 14, after "pulse" delete "pulscs".

In Column 14, Line 22, in Claim 14, delete "RF second" and insert -- second RF --, therefor.

Signed and Sealed this
Twenty-ninth Day of September, 2020

Andrei Iancu
*Director of the United States Patent and Trademark Office*